United States Patent [19]

Sundaresan et al.

[11] Patent Number: 4,950,618

[45] Date of Patent: Aug. 21, 1990

[54] MASKING SCHEME FOR SILICON DIOXIDE MESA FORMATION

[75] Inventors: Ravishankar Sundaresan, Garland; Mishel Matloubian, Dallas, both of Tex.

[73] Assignee: Texas Instruments, Incorporated, Dallas, Tex.

[21] Appl. No.: 338,719

[22] Filed: Apr. 14, 1989

[51] Int. Cl.⁵ ............. H01L 21/00; H01L 21/02; H01L 21/265; H01L 21/316

[52] U.S. Cl. ........................ 437/40; 437/41; 437/913; 437/63; 148/DIG. 53; 148/DIG. 82; 357/23.7

[58] Field of Search .......... 437/40, 41, 42, 46, 437/57, 913, 915; 148/33.3, DIG. 53, DIG. 83

[56] References Cited

U.S. PATENT DOCUMENTS

| | | | |
|---|---|---|---|
| 3,888,706 | 6/1975 | Dingwall | 437/72 |
| 4,050,965 | 9/1977 | Ipri et al. | 437/41 |
| 4,160,260 | 7/1979 | Weitzel et al. | 357/23.7 |
| 4,507,846 | 4/1985 | Ohno | 357/23.7 |
| 4,597,160 | 7/1986 | Ipri | 437/41 |
| 4,598,305 | 7/1986 | Chiang et al. | 357/23.7 |
| 4,603,469 | 8/1986 | Armiento et al. | 437/40 |
| 4,628,589 | 12/1986 | Sundaresan | 357/42 |
| 4,651,408 | 3/1987 | MacElwee et al. | 437/41 |
| 4,656,731 | 4/1987 | Lam et al. | 357/23.7 |
| 4,753,896 | 6/1988 | Matloubian | 437/39 |
| 4,766,482 | 8/1988 | Smeltzer et al. | 357/23.7 |
| 4,814,292 | 3/1989 | Sasaki et al. | 437/40 |
| 4,851,363 | 7/1989 | Troxell et al. | 437/40 |
| 4,883,766 | 11/1989 | Ishida et al. | 437/40 |

FOREIGN PATENT DOCUMENTS

| | | | |
|---|---|---|---|
| 0077737 | 4/1983 | European Pat. Off. | 437/40 |
| 0075238 | 6/1980 | Japan | 437/41 |
| 0116637 | 9/1981 | Japan | 437/41 |
| 0207676 | 12/1983 | Japan | |
| 0125662 | 7/1984 | Japan | 437/40 |
| 0086864 | 4/1987 | Japan | 437/40 |
| 0114266 | 5/1988 | Japan | 437/41 |
| 0128572 | 5/1989 | Japan | 437/40 |
| 8808202 | 10/1988 | World Int. Prop. O. | 357/23.7 |

OTHER PUBLICATIONS

MacIver, B., j-MOS: A versatile Power Field-Effect Transistor, IEEE Elect. Dev. Lett., vol. ED1-5, No. 5, May 1984, pp. 154–158.

Woo, D. Silicon Nitride Isolation of Phosphosilicate Glass Layer, Tech. Notes (RCA), Nov. 27, 1979, TN No. 1234, pp. 1–2.

Ipri, A., Low-Threshold Low-Power CMOS/SOS for High-Tureg. Counter Appl., IEEE Journal of Sol State Cir., vol. SC-11, No. 2, Apr. 1976, pp. 329–336.

Colinge, J., An SOI Voltage-Controlled Bipolar–MOS Device, IEEE Trans. on Elect. Dev., vol. EDL-34, Apr. 1987, pp. 845–849.

Primary Examiner—Brian E. Hearn
Assistant Examiner—B. Everhart
Attorney, Agent, or Firm—James T. Comfort; Melvin Sharp; Douglas A. Sorensen

[57] ABSTRACT

An improved masking stack (63) comprises a pad oxide (58), polysilicon (60) and nitride (62). After forming a photoresist pattern (64) over the stack (63), an anisotropic etch is performed to remove the nitride (62) and a portion of the polysilicon (60) not covered by the pattern (64). Another etch is performed to remove the remaining polysilicon (60) to leave at least a portion of the pad oxide (58). A boron implant (66) is conducted to form implant areas (68 and 70) within the unmasked silicon active device layer (56). A portion of the implant areas (68 and 70) is masked with nitride (72), and the unmasked silicon layer (56) is then etched. The masking stack (63) and the nitride (72) is removed and unprotected silicon layer (56) and implant areas (68 and 70) are covered with an oxide forming the silicon dioxide mesa (78).

8 Claims, 2 Drawing Sheets

MASKING SCHEME FOR SILICON DIOXIDE MESA FORMATION

TECHNICAL FIELD OF THE INVENTION

This invention relates in general to semiconductor processing, and in particular to a method for forming a silicon dioxide mesa with an improved masking scheme.

BACKGROUND OF THE INVENTION

The formation of an active device structure or mesa requires effective masking and etching procedures. In order to have an optimium structure for n-channel transistors, it is important to provide a pad oxide to cover the active area silicon during the implantation of boron. If there is no pad oxide covering the silicon during implantation, the implantation process will damage the surface of the silicon causing future topographic discontinuities.

Additionally, impurities have been found on the silicon surface after a mesa has been formed. These impurities or spikes are formed as a result of polymers that are a biproduct of the etching processes used to form the mesa. At best the spikes are merely obstructions to subsequent structure formation but if the spikes are too close to the mesa, an electrical short may be created.

In a prior method disclosed in U.S. Pat. No. 4,753,896, June 28, 1988, to Matloubian, assigned to Texas Instruments, Inc., which is incorporated herein by reference, an oxide/nitride/oxide stack is used to mask the active area. The etchants used in the process are not sufficiently selective between nitride and oxide, which may cause removal of the pad oxide, exposing the active silicon surface. The exposed silicon surface may then be damaged by the implantation of boron.

Additionally in the prior art, the etchants tend to produce polymers over the nitride. Once the polymers form, they serve as a mask to prevent continued etching of the nitride. Therefore, a mask of nitride over oxide remains in some locations, serving as a starting point for a silicon pillar or spike. Thus, there is a need for an improved masking scheme to form a silicon dioxide mesa without damaging the active area silicon and without creating spikes thereon.

SUMMARY OF THE INVENTION

The present invention disclosed herein comprises a method for forming an improved masking scheme for a silicon dioxide mesa on a semiconductor wafer which eliminates or substantially reduces problems associated with prior masking schemes. The present invention allows the formation of a silicon dioxide mesa without damaging the active area silicon and without forming silicon pillars or spikes.

In accordance with one aspect of the invention, an improved masking scheme is formed over a semiconductor wafer. A pad oxide is thermally grown over a silicon surface on the wafer. A polysilicon layer is then deposited over the pad oxide, followed by deposition of a nitride layer. It is preferable to use different plasma chemistries to etch the various layers of the nitride/polysilicon/oxide masking scheme, which allows a sufficient selectivity between the etching of the layers. Thus, it is possible to etch the nitride and the polysilicon without removing all of the pad oxide, which would result in damage to the active device silicon layer during boron implantation.

The nitride is etched with a fluorine-based plasma etchant and over-etched into the polysilicon layer. The polysilicon layer is then etched with a hydrogen chloride/hydrogen bromide etchant down to the pad oxide. A boron implant is then conducted, forcing boron into the silicon under the pad oxide. A blanket deposition of nitride is conducted, followed by an anisotropic etch thereof. Part of the nitride remains over the top of the polysilicon as well as on the sidewalls, since it is thicker in those locations. A wet deglaze is then performed to remove the pad oxide, and the silicon is reactive-ion etched.

A sidewall oxide is grown on the exposed sides of the silicon to seal the mesa. The nitride is removed from the top and sides of the polysilicon using hot phosphoric acid. The polysilicon is finally removed with an anisotropic or an isotropic etch, leaving a mesa to form active devices therein.

It is a technical advantage of the present invention that polymers are not formed creating unwanted silicon pillars during the etching of the stack of the masking scheme. It is a further technical advantage of the present invention that sufficient pad oxide remains after the etching of the masking scheme, which allows the silicon layer to be protected during the boron implant.

BRIEF DESCRIPTION OF THE DRAWINGS

For a more complete understanding of the present invention and for further advantages thereof, reference is now made to the following Detailed Description, taken in conjunction with the accompanying Drawings in which.

DETAILED DESCRIPTION OF THE INVENTION

Figure 1A:
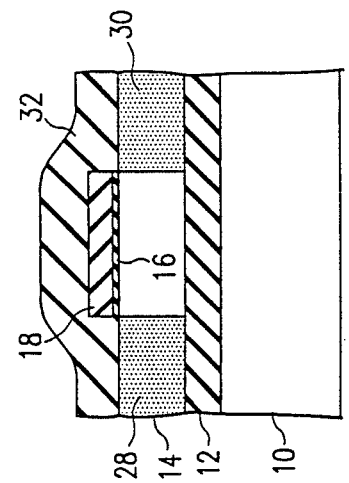
FIGS. 1a–e illustrate in cross-sectional views a method in accordance with the prior art.

A method for forming a masking scheme and for subsequently forming a mesa in accordance with the prior art is illustrated in cross-section in FIGS. 1a–d. Referring first to FIG. 1a, a silicon semiconductor wafer 10 has an oxide layer 12 and an active device silicon layer 14 formed thereon. In accordance with the prior art, a thermal oxide layer or pad oxide 16 is grown to a thickness of approximately 350 angstroms over the silicon layer 14. A nitride ($Si_3N_4$) layer 18 is then deposited, such as by chemical vapor deposition to a depth of approximately 1400 angstroms over the thermal oxide layer 16. A deposited oxide layer 20 is then formed over the nitride layer 18 by chemical vapor deposition to a thickness of approximately 3,200 angstroms.

A photoresist mask 22 is formed over the deposited oxide 20 by methods well known in the art, such as spinning on a layer of photoresist, exposing the layer of photoresist to light through a patterned mask and removing the unwanted photoresist. The photoresist mask 22 serves as a pattern for the oxide/nitride/oxide stack therebelow during subsequent steps. An anisotropic plasma etch using a fluorine-based etchant, such as $C_2F_2$/$CHF_3$/HE at 150 watts, is used to etch through the oxide 20, the nitride 18 and the pad oxide 16.

The fluorine-based etchant has relatively poor selectivity between oxide and nitride, and typically, the pad oxide 16 will be removed during the etch. Since the pad oxide 16 is removed, a subsequent implantation step may damage the surface of the active device silicon layer 14. Additionally, polymers formed on the nitride layer 18 during the plasma etch tend to serve as a mask for further etching, as will be subsequently described in greater detail.

Figure 1B:
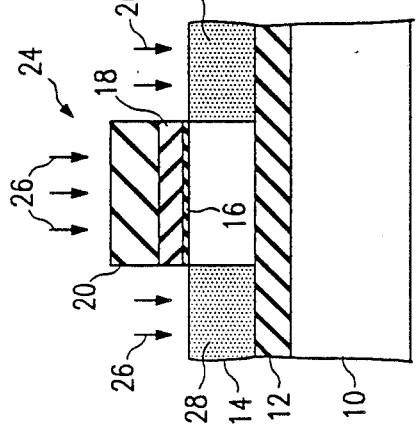

Referring to FIG. 1b, the oxide layer 20, nitride layer 18 and oxide layer 16 have been etched to form a masking stack generally identified by the reference numeral 24. The photoresist pattern 22 has been removed by a standard resist strip. A boron implant is then conducted, as indicated by the arrows 26, to force boron atoms into the exposed silicon layer 14, forming implanted areas 28 and 30. The masking stack 24 prevents boron from being implanted into the silicon layer 14 directly thereunder. A wet deglaze is then performed to remove the deposited oxide layer 20 from the stack 24.

Figure 1C:
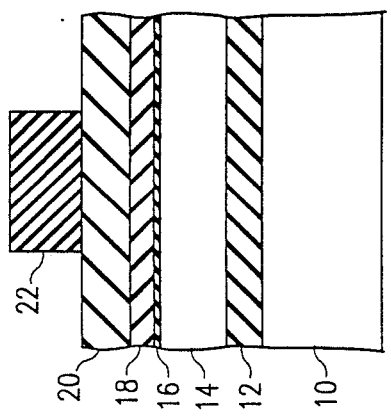

Referring to FIG. 1c, a chemical vapor deposition of oxide is conducted to form an oxide layer 32 over the entire device. An anisotropic, fluorine-based plasma etch is then performed to remove all of the oxide layer 32 except for filaments 34 and 36 (FIG. 1d) on the sides of the nitride layer 18 and the oxide layer 16. A reactive-ion etch (RIE) using a chlorine-based etchant is conducted to remove the silicon layer 14 not covered by the nitride 18, the oxide 16 and the filaments 34 and 36. The RIE leaves only the now reduced in size boron-implanted areas 28 and 30 that were protected by the filaments 34 and 36.

Figure 1D:
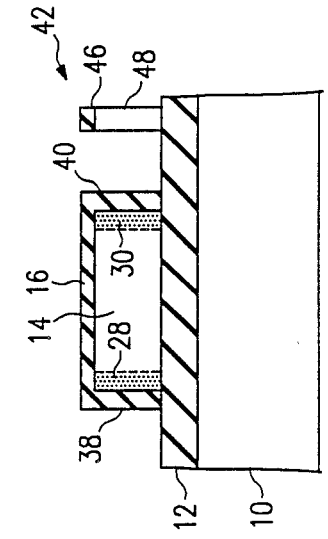

The sidewalls of the silicon layer 14 must be protected from subsequent process steps, therefore, sidewall oxide 38 and 40 is grown thereon, as shown in FIG. 1d. A spike 42 (not shown previously for the sake of clarity) is located on the oxide layer 12 spaced apart from the silicon layer 14. The spike 42 comprises nitride 44, oxide 46 and silicon 48. The nitride 44 is left over from the nitride layer 18 as a result of polymers which formed during the fluorine-based etch, as previously described above. The polymers served as a mask to prevent further etching of the nitride layer 18, resulting in the remaining speck of nitride 44. The nitride 44 then served as a mask to prevent removal of the oxide layer 16 and the silicon layer 14 thereunder, forming oxide 46 and silicon 48. The spike 42, if far enough away from the mesa structure being formed, is merely an inconvenience that is in the way of further fabrication steps. However, if the spike 42 is close enough to the mesa structure being formed, it may serve as a short which can damage the structures therein.

Figure 1E:
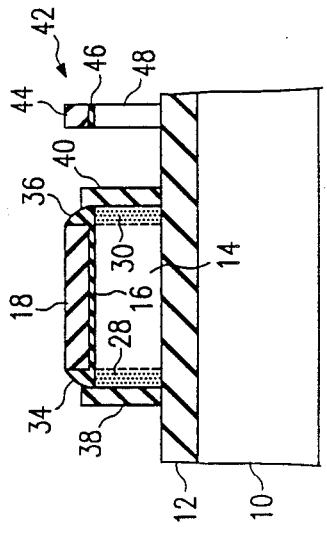

Referring to FIG. 1e, hot phosphoric acid has been used to remove the remaining nitride layer 18 and the nitride 44. An active device area or mesa 50 is thus formed allowing the subsequent implantation of active devices. The spike 42 remains proximate the mesa 50 as a result of the fabrication method.

Figure 2:
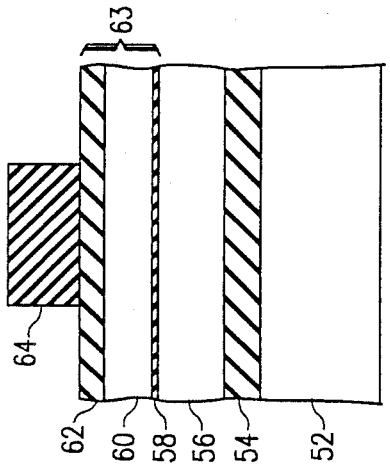

Referring to FIG. 2, a semiconductor wafer 52 having an oxide 54 and an active device silicon layer 56 is processed in accordance with the present invention. An improved masking scheme comprises a thermal oxide layer or pad oxide 58, polysilicon 60 and nitride 62. The pad oxide 58 is thermally grown to a depth of approximately 350 Angstroms over the silicon 56. The polysilicon 60 is then deposited by any appropriate method such as chemical vapor deposition to a depth of approximately 3,000 angstroms. The nitride 62 is then deposited over the polysilicon 60 by any appropriate method, such as chemical vapor deposition, to a depth of approximately 1,500 angstroms. A masking stack generally identified by the reference numeral 63, comprising the pad oxide 58, the polysilicon 60 and the nitride 62, is superior to the oxide/nitride/oxide stack in accordance with the prior art, as will be subsequently described in greater detail.

A photoresist pattern 64 is formed over the portion of the masking stack 63 that is to be protected. The pattern 64 is formed in accordance with techniques known in the art, such as spinning on resist, exposing the resist to light through a mask and removing the unwanted portions of the photoresist with a chemical wash.

Figure 3:
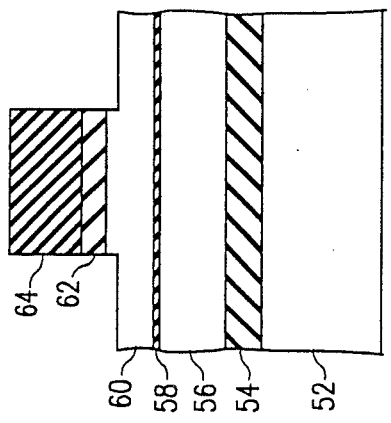

Referring to FIG. 3, a plasma etch has been performed on the masking stack 63 to remove the nitride 62 that is not protected by the photoresist pattern 64. The plasma etch may be an anisotropic, fluorine-based plasma using, for example, $C_2F_6/CHF_3/HE+O_2$ at 250 watts. The fluorine-based plasma etch rate of the nitride and polysilicon is approximately the same, and it is therefore a relatively simple procedure to stop the etch after removing all of the uncovered nitride 62 and a portion of the uncovered polysilicon 60. Since there is no oxide/nitride interface, as in accordance with the prior art, there is no polymer build-up during the etching, and therefore, no masking of nitride to form unwanted spikes or silicon pillars.

Figure 4:
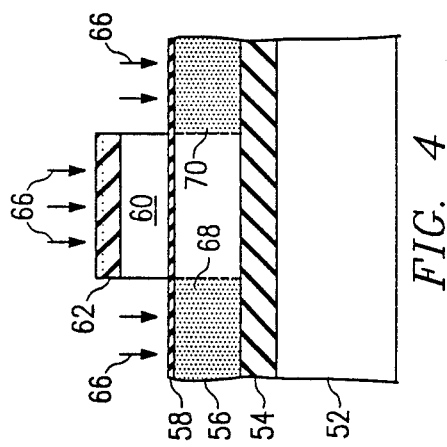
FIGS. 2–7 illustrate in cross-sectional views the method in accordance with the preferred embodiment of the present invention.

Referring to FIG. 4, a selective plasma etch is performed to remove the remaining polysilicon 60 not protected by the photoresist pattern 64. The etchant may comprise, for example, hydrogen chloride/hydrogen bromide, which is very selective to oxide. Thus, it is possible to effectively remove all the uncovered polysilicon 60 and still leave approximately 300 angstroms of the pad oxide 58. By leaving at least some of the pad oxide 58, the active device silicon layer 56 will be sufficiently protected during the boron implantation, which is subsequently performed. The photoresist pattern 64 is then removed by a resist strip.

A boron implantation, as illustrated by arrows 66, is conducted to force boron atoms into the active device silicon layer 56 not covered by the nitride 62 and the polysilicon 60. The boron implantation 66 forms implanted areas 68 and 70 in the active device silicon layer 56. Boron is also implanted into the unprotected portions of the pad oxide 58 and the nitride 62 but is of no significance to the final product. However, the pad oxide 58 has protected the integrity of the silicon active device layer 56 by shielding the surface thereof from damage by the boron implantation 66.

Figure 6:
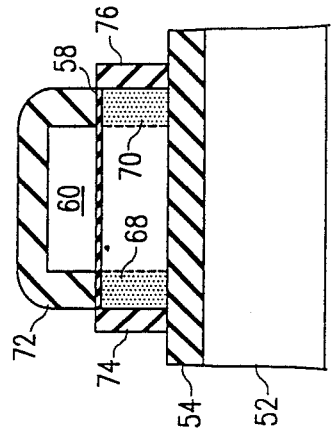
Figure 5:
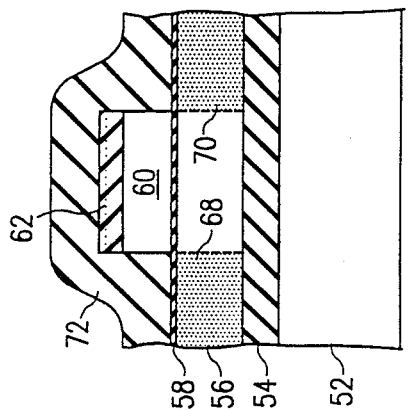

Referring to FIG. 5, additional nitride 72 is formed over the pad oxide 58 and the nitride 62. The nitride 72 is deposited by any appropriate method, such as chemical vapor deposition, to a thickness of approximately 1,000 angstroms. The nitride 72 is then anisotropically etched to remove all thereof from the pad oxide 58 (FIG. 6). Due to the extra thickness of nitride (nitride 72 plus nitride 62) over the polysilicon 60 and the edges thereof, a thin coating of nitride 72 remains over (plus nitride 62) and around the polysilicon 60. Additionally, a portion of the boron implanted areas 68 and 70 and the pad oxide 58 are covered by the nitride 72. The pad oxide 58 not covered by the nitride 72 is then removed by an appropriate etch.

A reactive-ion etch is then conducted to remove all of the active device silicon layer 56 except that which is protected by the nitride layer 72 (FIG. 6). A sidewall oxide 74 and 76 is then grown to seal the sidewalls of the reduced in size implant areas 68 and 70 of the active device silicon layer 56.

Figure 7:
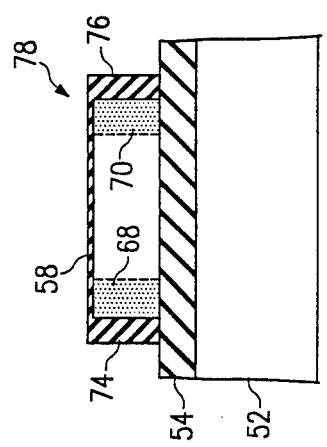

Referring to FIG. 7, the nitride 72 is removed by hot phosphoric acid. The polysilicon 60 remaining thereunder may then be removed using either an anisotropic or an isotropic polysilicon etch. A mesa 78 thus formed comprises pad oxide 58 and sidewall oxides 74–76 over the active device silicon layer 56 with boron implanted areas 68 and 70. The mesa 78 is superior to similar mesas formed in accordance with the prior art. The surface of the active device silicon layer 56 was protected by a sufficient quantity of pad oxide 58 and was therefore not damaged by the boron implantation. Additionally, no silicon pillars or spikes have been formed during the process conducted in accordance with the present invention.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. A method for forming a semiconductive mesa structure, comprising the steps of:
    forming a semiconductive layer on an insulating substrate;
    forming a layer of silicon dioxide on said semiconductive layer;
    forming a layer of silicon on said silicon dioxide layer;
    forming a layer of silicon nitride on said layer of silicon;
    forming a patterned mask on the surface of said layer of silicon nitride;
    etching the exposed areas of said silicon nitride layer to expose said silicon layer;
    etching the exposed areas of said silicon layer using an etch selective to silicon over silicon dioxide to expose said silicon dioxide layer;
    implanting dopant ions into said semiconductive layer using the remaining portions of said silicon layer and said silicon nitride layer as an implantation mask and said silicon dioxide layer serving as a protective coating on said semiconductor layer during said implantation;
    etching at least part of the exposed portion of said silicon dioxide layer to expose said semiconductive layer; and
    etching said semiconductive layer to expose portions of said insulating substrate.

2. The method of claim 1 further including the steps of:
    depositing a masking layer overall after the implantation of said dopant ions into said semiconductive layer; and
    anisotropically etching said masking layer to provide an etching mask for said etching of said silicon dioxide layer to expose said semiconductive layer and said etching of said semiconductive layer to expose said insulating substrate.

3. The method of claim 1 wherein said semiconductive layer comprises crystalline silicon.

4. The method of claim 2 wherein said masking layer comprises silicon nitride.

5. The method of claim 1 wherein said silicon nitride layer is etched using a fluorine based etchant.

6. The method of claim 5 wherein said fluorine based etchant is a plasma of $C_2F_6$ and $CHF_3$.

7. The method of claim 1 wherein said silicon layer is etched using a plasma of hydrogen chloride and hydrogen bromide.

8. The method of claim 1 wherein said silicon layer comprises polycrystalline silicon.

* * * * *